(12) United States Patent
Yano et al.

(10) Patent No.: US 8,299,801 B2
(45) Date of Patent: Oct. 30, 2012

(54) CAR BATTERY SYSTEM

(75) Inventors: Jyunya Yano, Kasai (JP); Kimihiko Furukawa, Kakogawa (JP); Kuniho Tanaka, Kasai (JP)

(73) Assignee: Sanyo Electric Co., Ltd., Osaka (JP)

( * ) Notice: Subject to any disclaimer, the term of this patent is extended or adjusted under 35 U.S.C. 154(b) by 476 days.

(21) Appl. No.: 12/565,163

(22) Filed: Sep. 23, 2009

(65) Prior Publication Data
US 2010/0073005 A1 Mar. 25, 2010

(30) Foreign Application Priority Data
Sep. 24, 2008 (JP) ................................. 2008-244923

(51) Int. Cl.
*G01N 27/416* (2006.01)
*H02J 7/00* (2006.01)
*H01M 2/00* (2006.01)

(52) U.S. Cl. ........ 324/427; 320/104; 320/116; 320/132; 320/149; 429/61; 429/124; 429/429

(58) Field of Classification Search .................... 324/427
See application file for complete search history.

(56) References Cited

U.S. PATENT DOCUMENTS

| | | | |
|---|---|---|---|
| 7,915,861 B2* | 3/2011 | Tsai | 320/132 |
| 2005/0225290 A1* | 10/2005 | Hashimoto et al. | 320/116 |
| 2006/0170396 A1* | 8/2006 | Ha et al. | 320/116 |
| 2007/0279006 A1* | 12/2007 | Takeuchi et al. | 320/135 |
| 2007/0284159 A1* | 12/2007 | Takami et al. | 180/65.1 |
| 2008/0000679 A1* | 1/2008 | Kamei et al. | 174/262 |
| 2008/0017408 A1* | 1/2008 | Morishita et al. | 174/260 |
| 2008/0042617 A1* | 2/2008 | Gamboa et al. | 320/107 |
| 2008/0157721 A1* | 7/2008 | Kaneko et al. | 320/136 |
| 2008/0284370 A1* | 11/2008 | Manor et al. | 320/103 |
| 2010/0033138 A1* | 2/2010 | Alger et al. | 320/153 |

FOREIGN PATENT DOCUMENTS
JP 2008-140631 6/2008

* cited by examiner

*Primary Examiner* — Drew A Dunn
*Assistant Examiner* — Nathaniel Pelton
(74) *Attorney, Agent, or Firm* — Wenderoth, Lind & Ponack, L.L.P.

(57) ABSTRACT

The car battery system of the present invention is provided with a battery block 2 that retains a plurality of battery cells 1 in a stacked configuration and has a terminal plane 2A, which is coincident with terminal surfaces 1A established by positive and negative battery cell 1 electrode terminals 13; and with a battery state detection circuit 30 that connects with the electrode terminals 13 of each battery cell 1. The battery system is provided with a circuit board 7 with surface-mounted electronic components 40 that implement the battery state detection circuit 30. The circuit board 7 is a single-sided board with electronic components 40 mounted on only one side, and the circuit board 7 is attached to the battery block 2 opposite the terminal plane 2A with the side having no electronic components 40 facing the battery block 2. The positive and negative electrode terminals 13 of each battery cell 1 are connected with the circuit board 7 for connection to the battery state detection circuit 30.

24 Claims, 13 Drawing Sheets

CAR BATTERY SYSTEM

BACKGROUND OF THE INVENTION

1. Field of the Invention

The present invention relates to a car battery system with battery state detection circuits connected to battery blocks having a plurality of battery cells connected in a stacked fashion.

2. Description of the Related Art

A car battery system has many battery cells stacked together and connected in series to increase the output voltage. In this type of battery system, battery cell degradation is prevented by controlling battery charging and discharging while detecting the state of each battery cell. Each battery cell connected in series is charged and discharged by the same current. Remaining battery capacity is computed by integrating battery charging and discharging currents, and charging and discharging is controlled to keep the remaining capacity within a set range. Remaining capacity is computed by adding integrated charging current values and subtracting integrated discharging current values. In practice, actual remaining capacity differences develop over time for battery cells charged and discharged by the same currents. This is because differences in battery cell temperature and electrical characteristics cause variation in the actual charging and discharging of each battery cell. If differences in actual remaining capacity develop, a battery cell with low remaining capacity can easily be over-discharged while a battery cell with high remaining capacity can easily be over-charged, and this can be the cause of battery cell degradation. This is because a battery cell can be significantly degraded by over-charging or over-discharging. Since a car battery system is provided with many battery cells, manufacturing cost is extremely high and extending system life-time is of utmost importance.

Battery cell degradation can be prevented by detecting the voltage of each battery cell and controlling actual remaining battery capacity to keep it in a set range. Therefore, in a battery system having battery blocks with many series-connected battery cells, battery state detection circuits that detect the voltage of each battery cell are provided. These battery state detection circuits are disposed next to the battery blocks and are connected to the positive and negative electrode terminals of each battery cell via a wire-harness (refer to Japanese Laid-Open Patent Publication No. 2008-140631 A).

As shown in the abbreviated view of FIG. 1 for example, a car battery system with many battery cells stacked together has a wire-harness 94 connected to the electrode terminals 93 of each battery cell 91, and this wire-harness 94 is connected to a battery state detection circuit 90 disposed outside the battery block 92. The wire-harness 94 has many long wire-leads 95 bundled together, and each wire-lead 95 is connected to an electrode terminal 93 of each battery cell 91 and to the battery state detection circuit 90. Not only is the wire-harness 94 long, but the lengths of the wire-leads 95 connecting different battery cells 91 are different. For example, wire-leads 95 connecting battery cells 91 furthest from the from the battery state detection circuit 90 are extremely long. In a long wire-harness with different length wire-leads, impedances of the wire-leads are high and there can be significant impedance differences for different wire-leads. Differences in wire-lead impedances can be the cause of battery cell voltage detection error in the battery state detection circuit. In particular, it is necessary for the battery state detection circuit to detect voltage differences between battery cells with extremely high precision. For example, a battery system with lithium-ion battery cells demands a very high individual battery cell voltage detection accuracy of 0.05V or better, and preferably 0.02V or better. Since prior art battery systems employ wire-harnesses with very long wire-leads bundled together, the large impedance of the wire-harness has become a cause of reduced individual battery cell measurement accuracy.

Further, since the wire-harness of a prior art battery system bundles together wire-leads connected to each battery cell, the battery system has the drawbacks that an open circuit in the wire-harness can cause functional failure and a short circuit between wires in the wire-harness can cause fire or smoke.

The present invention was developed with the object of resolving the drawbacks described above. Thus, it is an important object of the present invention to provide a car battery system that can reduce the line impedance for connections between each battery cell and a battery state detection circuit, and can make line impedances uniform to enable extremely high precision voltage measurements for the many battery cells. Further, it is another important object of the present invention to provide a car battery system that can effectively prevent malfunction, smoke, and fire due to a short circuit or open circuit in the wire-harness connecting the many battery cells with a battery state detection circuit. In this car battery system, stable, reliable detection of the condition of each battery cell by a battery state detection circuit can improve safety and reliability.

SUMMARY OF THE INVENTION

The car battery system of the present invention is provided with a battery block 2 that retains a plurality of battery cells 1 in a stacked configuration and has a terminal plane 2A, which is coincident with terminal surfaces 1A established by positive and negative battery cell 1 electrode terminals 13; and with a battery state detection circuit 30 that connects with the electrode terminals 13 of each battery cell 1 of a battery block 2 to detect the condition of each battery cell 1. Further, the car battery system is provided with a circuit board 7, 57, 67, 87 on which electronic components 40 are mounted to implement a battery state detection circuit 30. This circuit board 7, 57, 67, 87 is a single-sided circuit board that has electronic components 40 surface-mounted on one-side. The circuit board 7, 57, 67, 87 is mounted opposite the terminal plane 2A of a battery block 2 with the side of the circuit board 7, 57, 67, 87 without surface-mounted electronic components 40 facing the terminal plane 2A. In addition, the positive and negative electrode terminals 13 of each battery cell 1 in the car battery system are connected with a circuit board 7, 57, 67, 87 to connect with a battery state detection circuit 30.

The battery system described above has the characteristic that line impedances for connection between each battery cell and a battery state detection circuit can be low and uniform allowing extremely high precision measurement of the voltage of each of the many battery cells. This is because the circuit board for a battery state detection circuit in the battery system described above is disposed opposite the terminal plane of a battery block allowing positive and negative electrode terminals of each battery cell to connect to the circuit board over a minimum distance.

Further, the battery system described above has the characteristic that it can effectively prevent malfunction, smoke, and fire due to an open circuit or short circuit in a wire-harness connecting the many battery cells with a battery state detection circuit, and it can improve reliability and safety by insuring stable, reliable detection of the condition of each battery cell by a battery state detection circuit. This is because the circuit board for a battery state detection circuit is mounted opposite a battery block terminal plane, and the positive and negative electrode terminals of each battery cell are connected to the circuit board. In this configuration, a long wire-harness is not used, and electrode terminals can be connected to the circuit board, which is mounted in close proximity to battery cell electrode terminals. Wire routing for connections between each battery cell and the circuit board requires no bundling, twisting, or crossing of wire-leads. Therefore, faults such as short circuits between wire-leads are reliably prevented.

In the battery system described above, the circuit board is disposed opposite the terminal plane of a battery block. The circuit board is a single-sided board with electronic components implementing a battery state detection circuit surface-mounted on one-side, and those electronic components are mounted on the side of the circuit board that does not face the battery block. This configuration has the characteristic that electronic components are not mounted on the side of the circuit board facing the battery block, electronic components and associated conducting interconnects on the circuit board do not contact battery cell electrode terminals, and short circuits with conductors such as battery cell electrode terminals can be more reliably prevented. Further, since electronic components are disposed on one-side of the circuit board, the circuit board can be made thin, and the battery system achieves the feature that it can be made thin.

The above and further objects of the present invention as well as the features thereof will become more apparent from the following detailed description to be made in conjunction with the accompanying drawings.

DETAILED DESCRIPTION OF THE PREFERRED EMBODIMENT(S)

Figure 1:
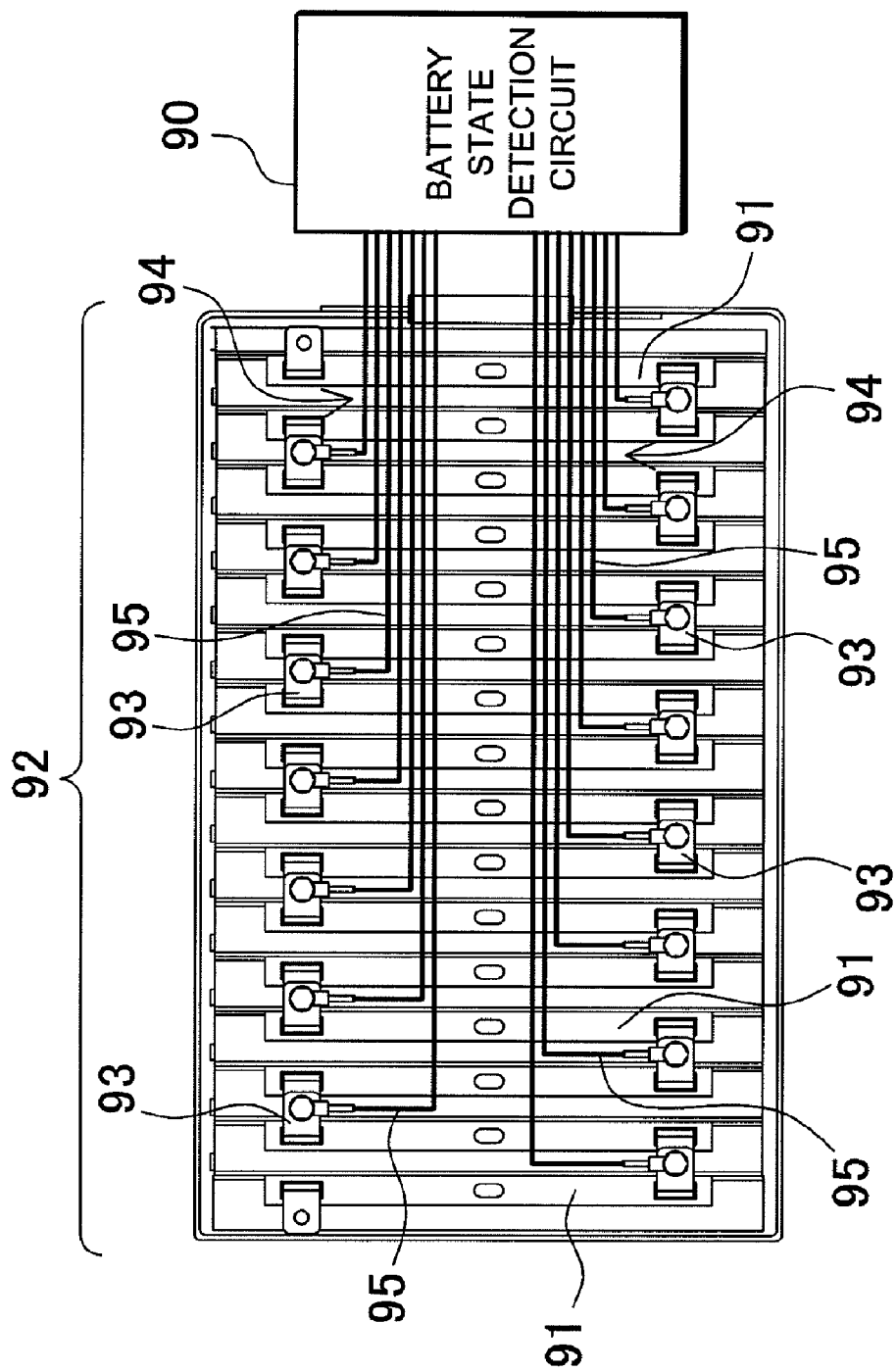
FIG. 1 is an abbreviated plan view of a prior art car battery system.

In the car battery system, the circuit board 57, 67 is provided with an insulating layer 57Y, 67Y on the side facing the battery block 2. This car battery system has the characteristic that battery cell short circuits can be prevented more reliably by the insulating layer provided on the surface of the circuit board facing the battery block.

In the car battery system, temperature sensors 38, which are in thermal contact with the battery cells 1 for battery temperature measurement, can be connected to the circuit board 7, 87. In this car battery system, temperature sensors can be disposed in ideal locations while insuring reliable connection by minimizing the distance between temperature sensors and battery state detection circuits.

In the car battery system, a liquid filling opening 14 is provided on the terminal surface 1A of each battery cell 1, and the circuit board 7, 87 can have through-holes 7A, 87A opened at positions opposite the battery cell 1 liquid filling openings 14. In this battery system, many battery cells can be connected together to form a battery block, a circuit board can be mounted on the battery block, and in that configuration each battery cell can be filled with electrolyte. This eliminates the necessity to hold battery cells in a tray to avoid battery cell expansion during electrolyte filling as in prior art battery systems. It also eliminates any requirement to assemble a battery block by removing filled battery cells from the holding tray and applying pressure to maintain the specified shape of expanded battery cells. Further, since the many battery cells can be filled after being connected together, there is no need to place the battery cells in a tray for electrolyte filling. Consequently, this battery system has the characteristic that the electrolyte filling process can be efficiently performed.

In the car battery system, a safety valve exhaust opening 12 is provided on the terminal surface 1A of each battery cell 1, and the circuit board 87 can have gas outlet holes 87B opened at positions opposite the safety valve exhaust openings 12 to pass discharged gas. If a safety valve opens during battery system operation and battery chemicals such as gas are exhausted, that gas can be smoothly discharged.

In the car battery system, a safety valve exhaust opening 12 is provided on the terminal surface 1A of each battery cell 1, and a gas exhaust duct 6 can be disposed between the battery block 2 terminal plane 2A and the circuit board 7 in a manner connecting battery cell exhaust openings 12. This battery system can smoothly discharge gas exhausted from a safety valve through the gas exhaust duct, and even if the exhausted gas is high temperature gas, there are no detrimental effects on the batteries or circuit board due to the high temperature gas.

In the car battery system, the circuit board 7 can be attached to the gas exhaust duct 6. In this battery system, the circuit board can be reliably mounted on a battery block via the gas exhaust duct, which is attached to the battery block.

In the car battery system, the circuit board 7, 57, 67, 87 can be connected to the positive and negative electrode terminals 13 of each battery cell 1 via voltage detection lines 8, 48, 58, 68, 78, and each voltage detection line 8, 48, 58, 68, 78 can be connected to approximately the same location on each electrode terminal.

In the car battery system, a voltage detection line 48 connected to an electrode terminal 13 can have a connector 42 attached at one end, and that connector 42 can mate with another connector 43 mounted on the circuit board 7 to connect the electrode terminal 13 to the circuit board 7.

In the car battery system, the circuit board 7 can be connected to the positive and negative electrode terminals 13 of each battery cell 1 by voltage detection lines 58, 68, and each voltage detection line 58, 68 can be conductive metal wire that can deform in a flexible manner.

The following describes embodiments based on the figures. The battery system is most appropriately used as a power source for an electric driven vehicle such as a hybrid car, which is driven by both an electric motor and an engine, or an electric automobile, which is driven by an electric motor only.

The battery system shown in FIGS. 2-7 is provided with battery blocks 2 that retain a plurality of battery cells 1 in a stacked configuration, and battery state detection circuits 30 that connect to the electrode terminals 13 of each battery cell 1 of each battery block 2 to detect the condition of each battery cell 1.

Figure 8:
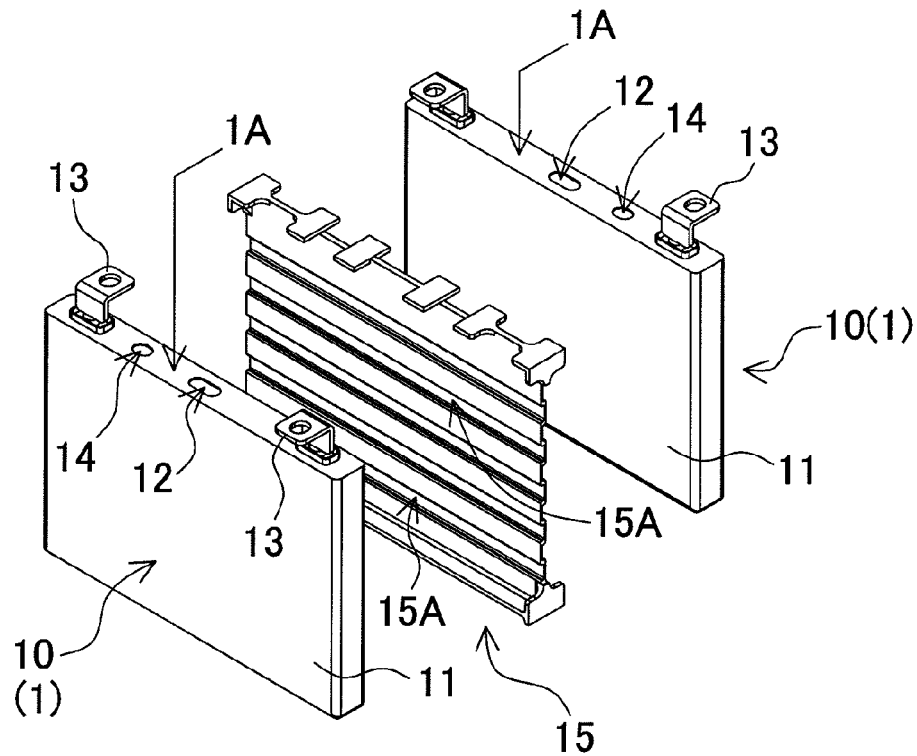
FIG. 8 is an exploded oblique view showing the stacking configuration for battery cells and spacers.

In a battery block 2, battery cells 1 are stacked to position their terminal surfaces 1A, which are provided with positive and negative electrode terminals 13, in a single plane that is the terminal plane 2A on the upper surface of the battery block 2. A battery holder 3 is attached outside the battery block 2 to hold the stacked battery cells 1. As shown in FIG. 8, each battery cell 1 is a rectangular battery 10 with a rectangular outline having a terminal surface 1A as its upper surface in the figure, and this terminal surface 1A is provided with positive and negative electrode terminals 13, a safety valve exhaust opening 12, and a liquid filling opening 14.

As shown in FIG. 8, a rectangular battery 10 is wide compared to its thickness. These rectangular batteries 10, which are thinner than they are wide, are stacked in the direction of the thin dimension to form a battery block 2. The rectangular batteries 10 are lithium-ion rechargeable batteries. However, the rectangular batteries can also be rechargeable batteries such as nickel-hydride batteries or nickel-cadmium batteries. The rectangular batteries 10 of the figure have rectangular shapes with wide surfaces on both sides, and those side surfaces are stacked against one another to form a battery block 2. The terminal surface 1A of each rectangular battery 10 is provided with positive and negative electrode terminals 13 protruding from both ends, and a safety valve exhaust opening 12 in the center region.

When the internal pressure of the battery cell 10 becomes greater than a set pressure, the safety valve opens to prevent excessive internal pressure rise. The safety valve houses a valve mechanism (not illustrated) that closes off the exhaust opening 12. The valve mechanism has a membrane that breaks at a set pressure, or it is a valve with a flexible component that presses against a valve seat and opens at a set pressure. When the safety valve is opened, the interior of the rectangular battery 10 is opened to the outside through the exhaust opening 12, and internal gas is exhausted to prevent internal pressure build-up.

Figure 9:
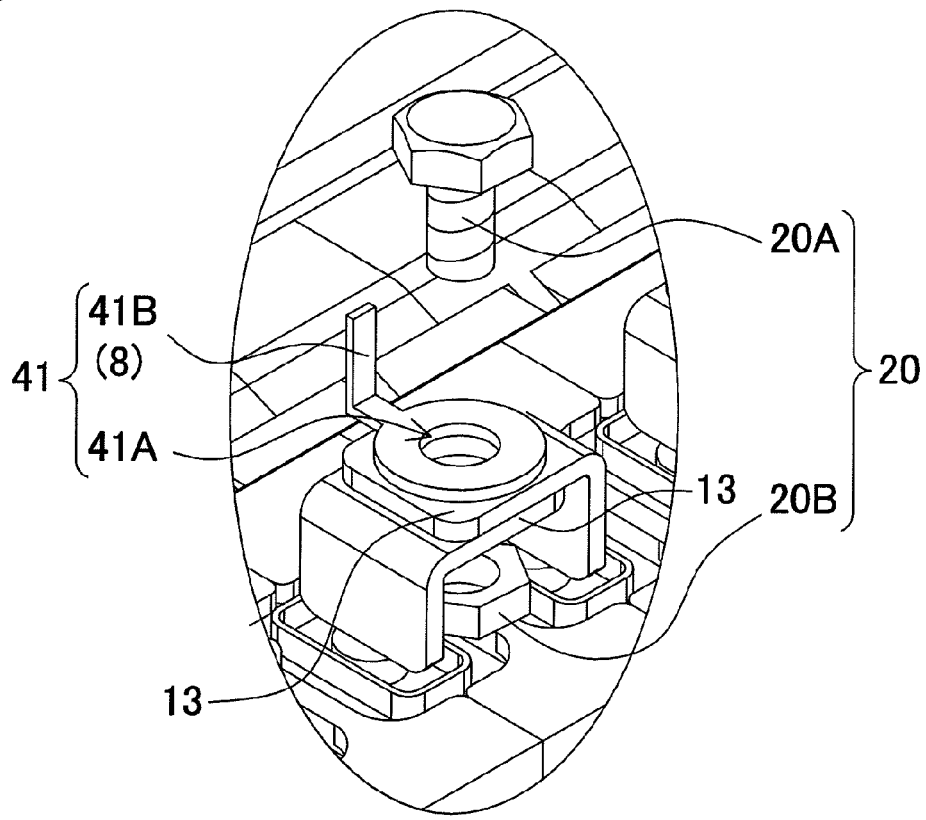
FIG. 9 is an enlarged oblique view showing the connecting structure for electrode terminals and connecting terminals.

Further, the positive and negative electrode terminals 13 of each rectangular battery 10 are bent in opposite directions, and the positive and negative electrode terminals 13 of adjacent rectangular batteries 13 are also bent in opposite directions. In the battery system of the figures, positive and negative electrode terminals 13 of adjacent rectangular batteries 10 are connected in an overlapping configuration to connect the batteries in series. As shown in FIG. 9, overlapping electrode terminals 13 are connected by fasteners 20 such as a bolt 20A and nut 20B. However, positive and negative electrode terminals can also be connected via bus-bars to connect the batteries in series. A battery system with adjacent rectangular batteries 10 connected in series can produce a high output voltage. However, the battery system can also connect adjacent rectangular batteries in parallel.

A battery block 2 has spacers 15 sandwiched between stacked rectangular batteries 10. The spacers 15 insulate adjacent rectangular batteries 10. As shown in FIG. 8, a spacer 15 has a shape that fits rectangular batteries 10 in fixed positions on both sides, and allows adjacent rectangular batteries 10 to be stacked without shifting position. Rectangular batteries 10 stacked in an insulating manner with spacers 15 can have external cases 11 made of metal such as aluminum. A battery block can also stack and retain a plurality of battery cells without intervening spacers. Although not illustrated, this type of battery block insulates the metal surfaces of rectangular battery external cases by covering them with an insulating film. For example, plastic heat-shrink tubing or insulating coating can be used as an insulating film. In addition, the external case of a rectangular battery cell can be made of an insulating material such as plastic. These types of rectangular batteries can be stacked together without intervening spacers to form battery blocks.

Figure 3:
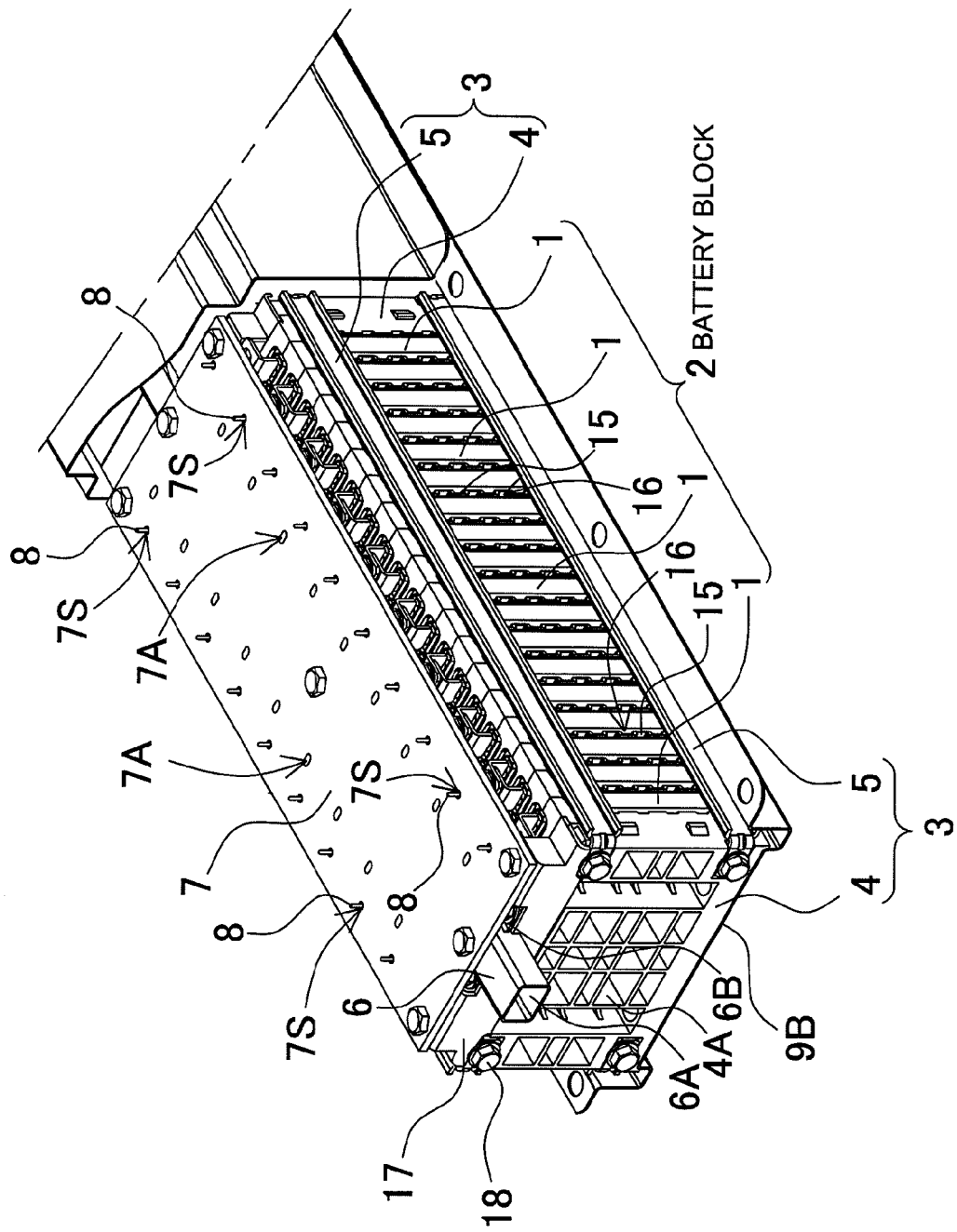
FIG. 3 is an oblique view of the car battery system shown in FIG. 2 with the upper case removed.
Figure 4:
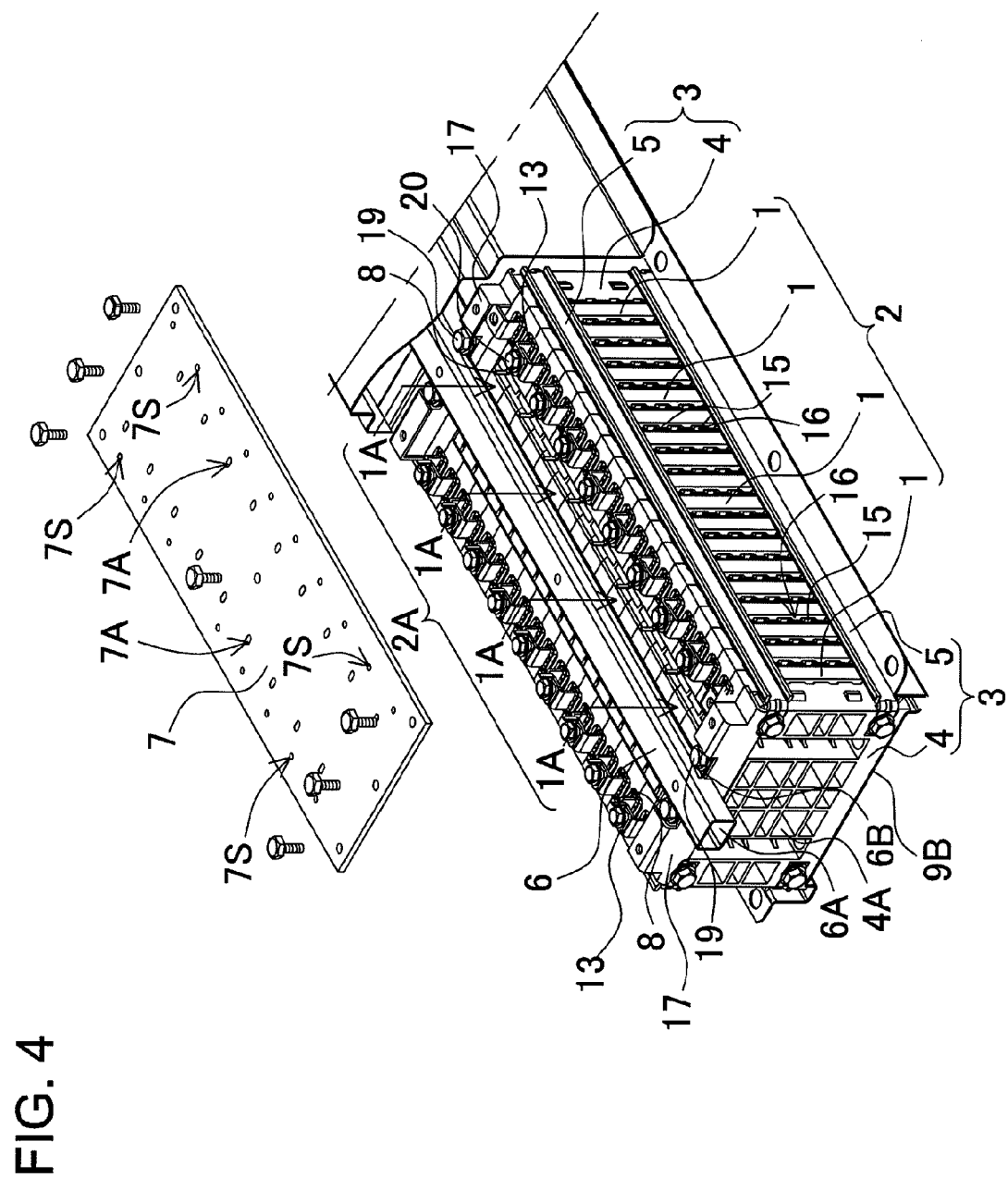
FIG. 4 is an exploded oblique view of the car battery system shown in FIG. 3.

Spacers 15 stacked with the battery cells 1 are provided with cooling gaps 16 between the spacers 15 and the battery cells 1 to pass a cooling gas such as air to effectively cool the battery cells 1. The spacer 15 of FIG. 8 is provided with grooves 15A in its surfaces opposite the battery cells 1 that extend to the edges on both sides and establish cooling gaps 16 between the spacer 15 and the battery cells 1. The spacer 15 of the figure is provided with a plurality of grooves 15A having parallel orientation and disposed at given intervals. The spacer 15 of the figure is provided with grooves 15A on both sides to establish cooling gaps 16 between the spacer 15 and adjacent battery cells 1. This structure has the characteristic that battery cells 1 on both sides of the spacer 15 can be effectively cooled by cooling gaps 16 formed on both sides of the spacer 15. However, grooves can also be provided on only one side of the spacer to establish cooling gaps between battery cells and spacers. The cooling gaps 16 of FIGS. 3 and 4 are established extending in a horizontal direction and opening on the left and right sides of the battery block 2. Ventilating air passed through the cooling gaps 16 efficiently cools battery cell 1 external cases 11 directly. This configuration has the characteristic that battery cell 1 thermal runaway can be effectively prevented, and battery cells 1 can be efficiently cooled.

The battery holder 3, which retains battery cells 1 in a stacked configuration, is provided with a pair of endplates 4 that sandwiches the battery block 2 from both ends, and connecting rails 5 connected at both ends or mid-regions to a pair of endplates 4. Connecting rails 5 are disposed at rectangular battery 10 perimeters, and both ends or mid-regions are connected to endplates 4. The battery holder 3 holds a battery block 2 of stacked battery cells 1 with endplates 4 at both ends and with connecting rails 5 disposed at rectangular battery 10 perimeter surfaces and connected to the endplates 4 at both ends. With this structure, the battery holder 3 securely holds a plurality of stacked rectangular batteries 10.

The endplates 4 have a rectangular shape with the same dimensions and shape as the outline of the rectangular batteries 10, and the endplates 4 hold the stacked battery block 2 from both ends. An endplate 4 is made of plastic or metal and is provided with reinforcing ribs 4A extending vertically and horizontally on the outer surface, which is formed as a single piece with the endplate 4. Further, the endplates 4 shown in the figures have reinforcing metal pieces 17 fixed along their upper edges, and connecting rails 5 are connected to those reinforcing metal pieces 17. This configuration has the characteristic that endplates 4 reinforced with reinforcing metal pieces 17 have a robust structure, and connecting rails 5 can be solidly connected to the endplates 4. In particular, this configuration has the characteristic that it can make molded plastic endplates 4 inherently strong. However, endplates do not always need to be reinforced with reinforcing metal pieces. For example, endplates can also be made of metal with no reinforcing metal pieces, and connecting rails can be directly connected to those endplates. The connecting rails 5 are made of metal such as steel and attach at both ends or mid-regions to endplates 5 via set screws 18.

Figure 6:
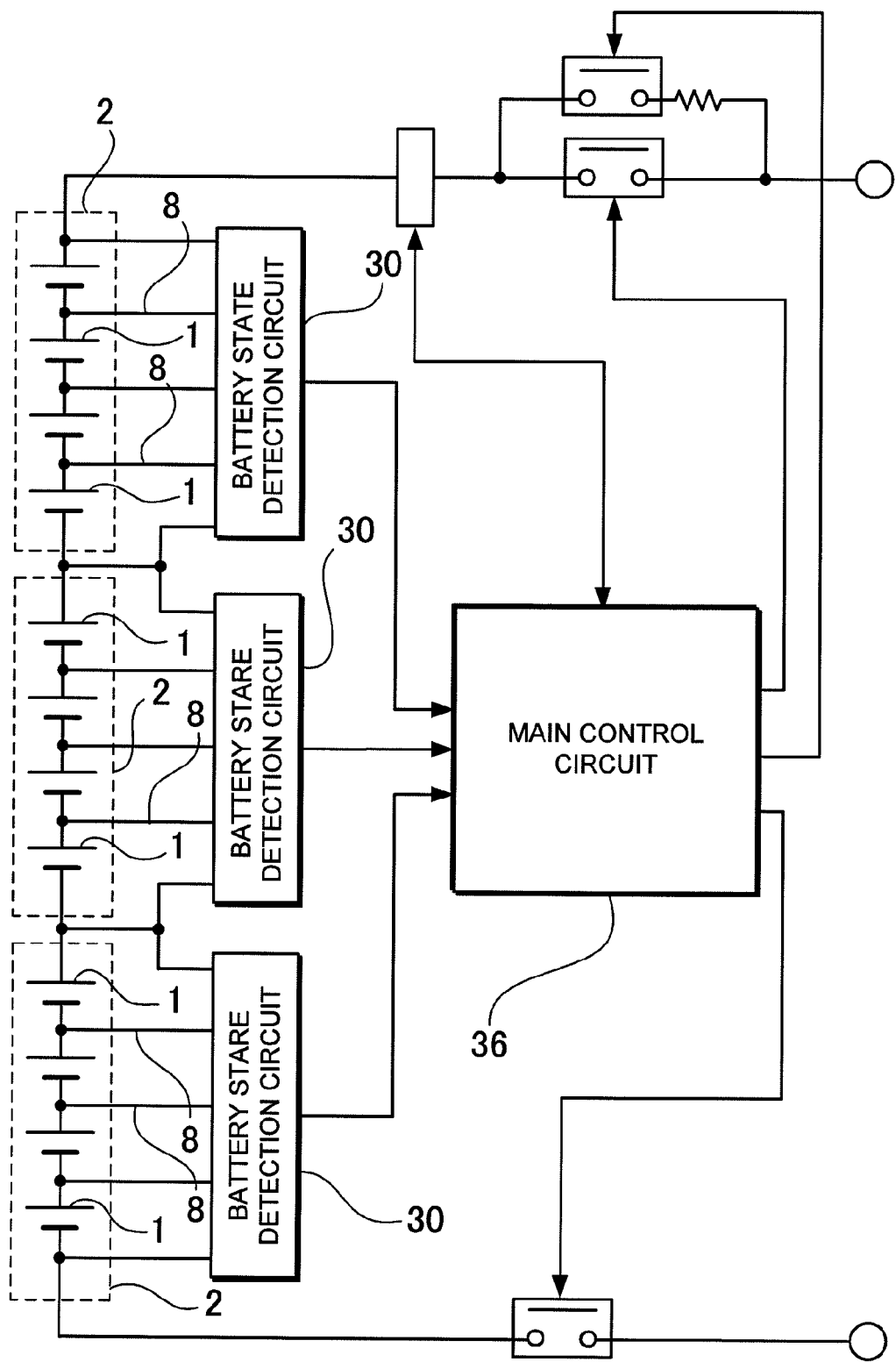
FIG. 6 is a block diagram of a car battery system for one embodiment of the present invention.
Figure 7:
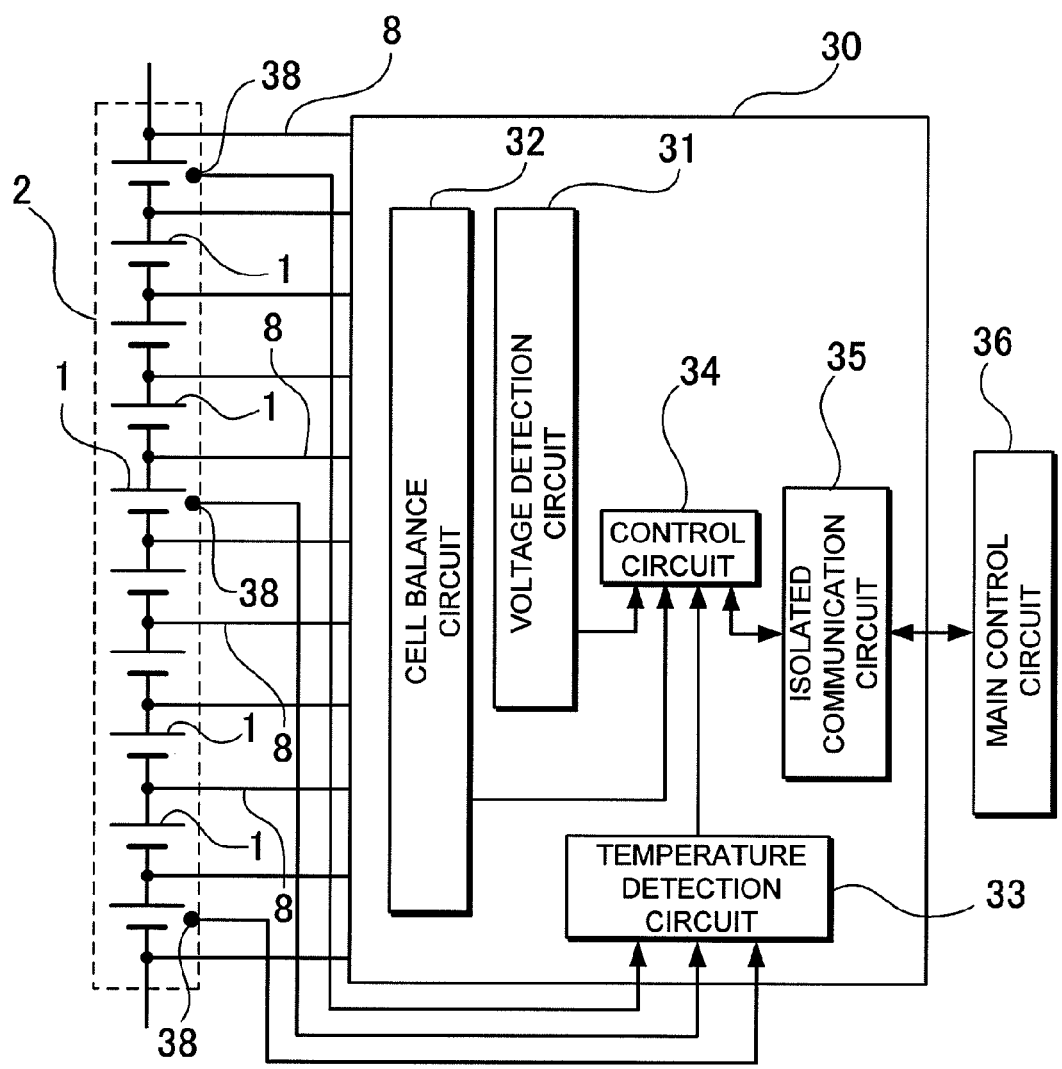
FIG. 7 is a block diagram of a battery state detection circuit.

FIGS. 6 and 7 show block diagrams of the battery system. In the battery system of these block diagrams, a battery state detection circuit 30 is connected to each battery cell 1. The battery state detection circuit 30 shown in FIG. 7 is provided with a voltage detection circuit 31 to detect the voltage of each battery cell 1; a cell balance circuit 32 to equalize the voltage of each battery cell 1; a temperature detection circuit 33 to detect battery temperature; and a control circuit 34 to control these detection and balance circuits, process signals input from those circuits, and output that data from the battery state detection circuit 30 via an isolated communication circuit 35. The battery system of FIG. 6 is provided with a plurality of battery blocks 2, and signals output from battery state detection circuits 30 connected to each battery block 2 are input to a main control circuit 36. The main control circuit 36 controls the battery system based on the signals input from each battery state detection circuit 30.

Figure 5:
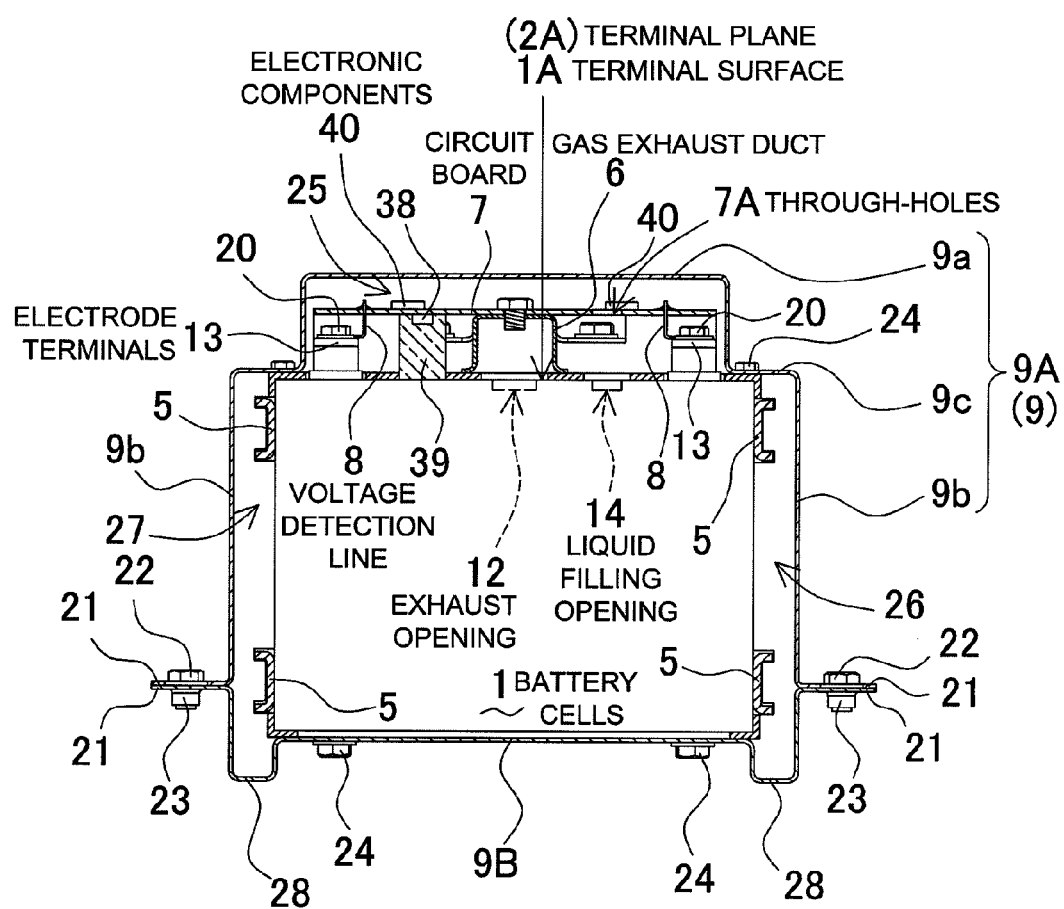
FIG. 5 is a lateral cross-section view of the car battery system shown in FIG. 2.
Figure 10:
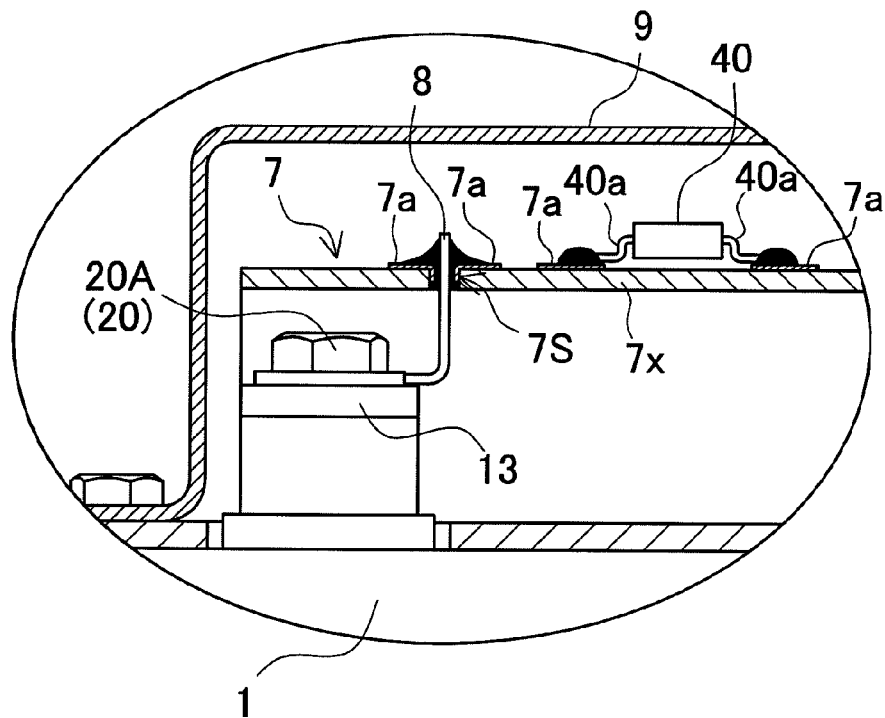
FIG. 10 is an enlarged cross-section view showing the attachment structure for the circuit board of the battery system shown in FIG. 5 and the battery block.
Figure 11:
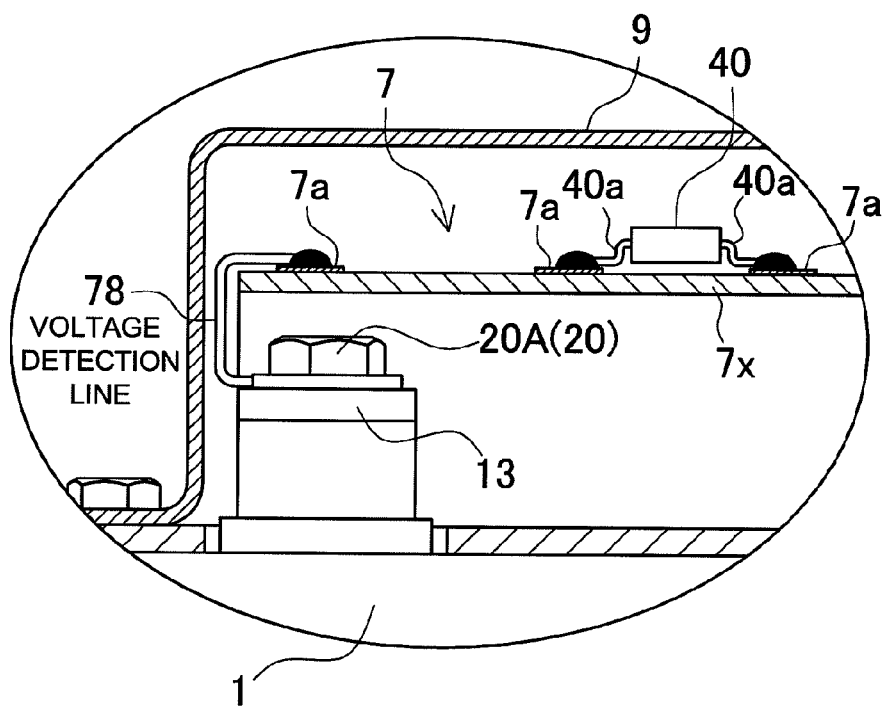
FIG. 11 is an enlarged cross-section view showing another example of circuit board to battery block attachment.
Figure 12:
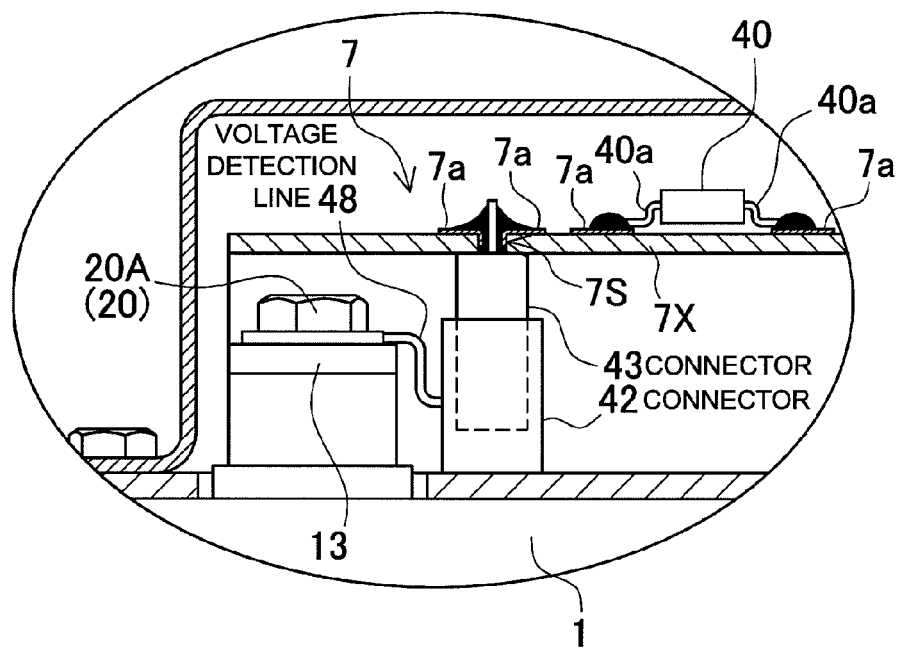
FIG. 12 is an enlarged cross-section view showing another example of circuit board to battery block attachment.

Electronic components 40 to implement a battery state detection circuit 30 are surface-mounted on a circuit board 7. This circuit board 7 is a single-sided board with electronic components 40 mounted on only one side. As shown in FIGS. 3-5, a circuit board 7 with electronic components 40 mounted on one-side is attached opposite the battery block 2 terminal plane 2A, which is on the top of the battery block 2 in the figures. Further, the single-sided circuit board 7 is mounted on the battery block 2 in a manner disposing the electronic components 40 on the side of the circuit board 7 that does not face the battery block 2 terminal plane 2A. FIGS. 10-12 show single-sided circuit boards 7 mounted on a battery block 2. In these and other figures, electronic components 40 are surface-mounted on the upper surface (top side) of the single-sided circuit board 7, and the bottom surface (back side) of the circuit board 7 is the side facing the battery block 2. Specifically, electronic components 40 are not mounted on the back side of the circuit board 7 facing the battery block 2. In the circuit boards 7 of FIGS. 10-12, thin metal-layer conducting regions 7a are provided only on the upper surface that does not face the battery block 2. Electronic component 40 leads 40a are soldered to the conducting regions 7a to surface-mount the electronic components 40 to the upper surface. Further, in the circuit board 7 of FIG. 10, through-holes 7S are provided that pass through the top and bottom surfaces of the circuit board 7. Voltage detection lines 8 that connect with electrode terminals 13 are inserted in the through-holes 7S and solder-attached to the circuit board 7. In the circuit board 7 of FIG. 11, voltage detection lines 78 that connect with electrode terminals 13 are routed around circuit board 7 edges to the top of the circuit board 7 and solder-attached to conducting regions 7a provided on the upper surface. In the circuit board 7 of FIG. 12, connectors 43 are mounted on the bottom side of the circuit board 7, and these connectors 43 mate with connectors 42 that are connected to electrode terminals 13 via voltage detection lines 48. Since the conducting regions 7a of these single-sided circuit boards 7 are established on the side facing away from the battery block 2, the insulating board 7x of the circuit board 7 is exposed on the side facing the battery block 2, and that is an insulating surface. This is because a circuit board 7 is an insulating board 7x made of insulating material such as phenol resin or glass epoxy resin with conducting regions 7a established on one side.

Figure 13:
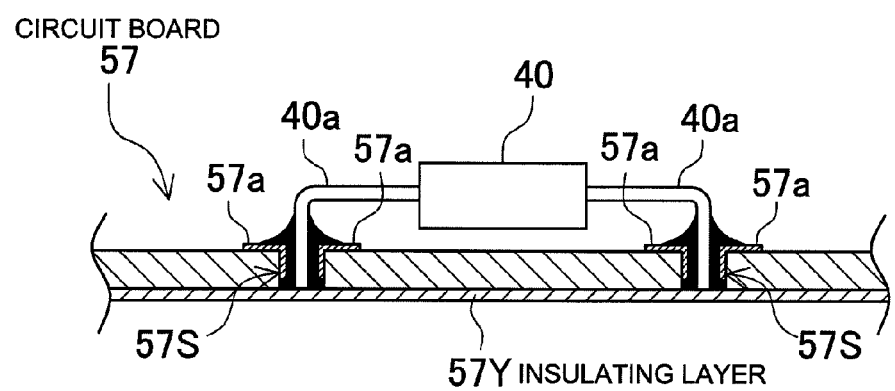
FIG. 13 is an enlarged cross-section view showing another example of the circuit board.
Figure 14:
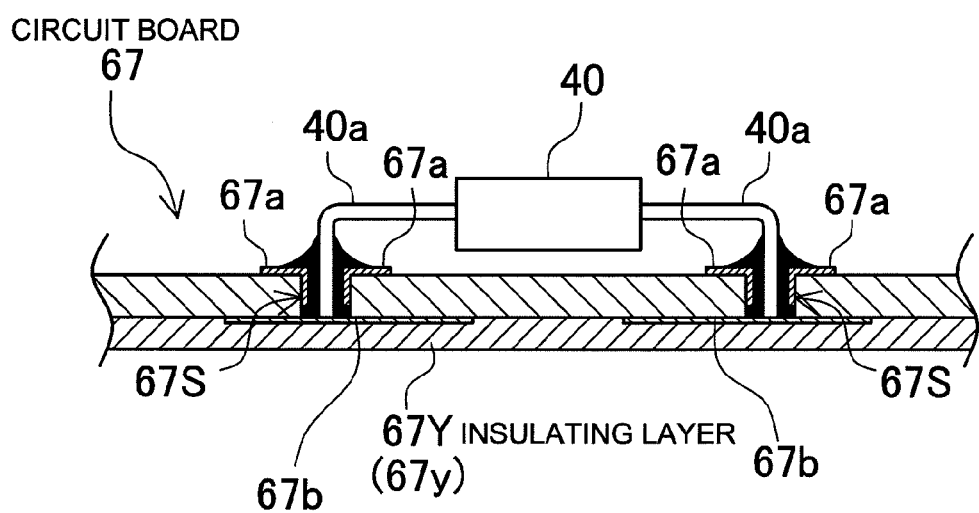
FIG. 14 is an enlarged cross-section view showing another example of the circuit board.

In the single-sided circuit board 57 of FIG. 13, electronic component 40 leads 40a are inserted into through-holes 57S, and those leads 40a are solder-attached to circuit board 57 conducting regions 57a. Subsequently, an insulating layer 57Y is provided on the side of the circuit board 57 facing the battery block 2. The insulating layer 57Y is established by bonding an insulating sheet, or by applying an insulating resist coating. The insulating layer 57Y can also be insulating material such as epoxy resin or silicone. The circuit board 67 of FIG. 14 is a double-layer board with a blind layer 67y, which is an insulating layer 67Y, and this blind layer 67y is laminated on the side of the circuit board 67 facing the battery block 2. In this circuit board 67, the side facing the battery block 2 can be insulated by the blind layer 67y, which is the insulating layer 67Y, while solder-attaching electronic component 40 leads 40a to conducting regions 67a connected to through-holes 67S. Further, a conducting layer 67b can be provided at the interface with the blind layer 67y, and radiation of heat away from the electronic components 40 can be improved, or the electrical resistance of the conducting regions 67a can be reduced with this conducting layer 67b.

The circuit board 7 of FIGS. 3 and 4 has both ends attached to endplates 4. In addition, the circuit board 7 of the figures is also attached to the top of the gas exhaust duct 6, which is mounted on the battery block 2 terminal plane 2A. A circuit board 7 can be solidly mounted on the battery block 2 by attaching it to the gas exhaust duct 6.

The circuit board 7 is provided with through-holes 7A to fill battery cell 1 external cases 11 with electrolyte through the liquid filling openings 14 established in battery cell 1 terminal surfaces 1A. These through-holes 7A are opened in positions opposite the liquid filling openings 14 in the battery cells 1. In this battery block 2, battery cells 1, which have not been filled with electrolyte, are stacked together, held between endplates 4, and the circuit board 7 is attached. In this state, each battery cell 1 is filled with electrolyte, and the liquid filling openings 14 are closed off to complete assembly of the battery block 2. For a battery block 2 assembled in this manner, there is no need to arrange a plurality of battery cells 1 in a holding tray to avoid cell expansion, and battery cells 1 can be filled efficiently while stacked together and retained in a manner avoiding cell expansion. Further, since battery cell 1 external cases 11 are filled with electrolyte with the battery block 2 in the assembled state, malfunctions such as short circuits occurring at this process step can be prevented allowing safe assembly.

The circuit board 7 is mounted in close proximity and in a parallel orientation with respect to the battery block 2 terminal surface 2A. The circuit board 7 of FIG. 5 has temperature sensors 38 mounted on its bottom surface. The temperature sensors 38 are in thermal contact with battery cells 1 and measure battery temperature. In this structure, the circuit board 7 is mounted opposite the battery block 2 terminal surface 2A and the temperature sensors 38 can be held in thermal contact with battery cells 1. Electrically insulating, thermally conducting material 39 is disposed between a temperature sensor 38 and a battery cell 1 to allow more accurate battery cell 1 temperature measurement. A battery state detection circuit 30 that measures battery cell 1 temperature via temperature sensors 38 outputs the detected temperature outside the battery state detection circuit 30. If battery temperature rises above a set temperature or drops below a set temperature, charging and discharging currents are limited or cut-off.

The circuit board 7 is connected to the positive and negative electrode terminals 13 of each battery cell 1 through voltage detection lines 8. Voltage detection lines 8 connect the positive and negative electrode terminals 13 of each battery cell 1 with the voltage detection circuit 31 in the battery state detection circuit 30 mounted on the circuit board 7. For example, a battery block with eighty battery cells stacked together is connected to a circuit board with eighty one voltage detection lines. The voltage detection circuit 31 measures the voltage of each battery cell 1 via the voltage detection lines 8. The battery state detection circuit 30 determines the condition of the battery cells 1 using battery cell 1 voltages measured by the voltage detection circuit 31, and outputs the results outside the battery state detection circuit 30.

Adjacent battery cells 1 of a battery block 2 are connected in series by joining overlapping electrode terminals 13 with fasteners 20, or by joining electrode terminals via bus-bars. High currents flow in a battery block 2 and voltage drops are generated by the resistance of electrode terminal 13 connecting regions. These voltage drops increase in proportion to battery block 2 current. To prevent measurement error due to connecting region voltage drops, voltage detection lines 8 are connected at approximately the same location for each battery cell 1. Specifically, voltage detection lines 8 are connected to add the connecting region voltage drop to the voltage of each battery cell 1.

Voltage detection lines 8 are attached at one end to an electrode terminal 13, and at the other end to the circuit board 7. A voltage detection line 8 is attached to an electrode terminal 13 via a connecting terminal 41. As shown in FIG. 9, the connecting terminal 41 is attached to an electrode terminal 13 via fasteners 20 that connect adjacent electrode terminals 13. The connecting terminal 41 shown in this figure is formed from sheet metal and is provided with a connecting hole 41A at one end to insert a fastener 20 bolt 20A, and a vertical connecting section 41B at the other end with a long narrow rod-shape that is bent upward to a vertical disposition. The upright connecting section 41B of this connecting terminal 41 is used as the voltage detection line 8 and is inserted through the circuit board 7. Voltage detection lines 8 inserted through the circuit board 7 are fixed to the circuit board 7 by soldering. However, voltage detection lines can also be routed from both sides of the circuit board to connect the circuit board and electrode terminals. Although not illustrated, in a battery block with electrode terminals connected via bus-bars, the bus-bar metal plates can be formed to establish voltage detection lines. Further, circuit board voltage detection lines can be directly connected to electrode terminals via spot welding or laser welding without using connecting terminals. Voltage detection lines can also be connected to electrode terminals via connectors.

In the battery system of FIG. 12, a voltage detection line 48 connected to an electrode terminal 13 has a connector 42 attached at one end, and that connector 42 mates with another connector 43 mounted on the circuit board 7. Since a gas exhaust duct 6 is disposed at the center regions of battery cell 1 terminal surfaces 1A in the battery system of the figures, connectors 42 are disposed at both sides of the terminal surfaces 1A. The connectors 42 are disposed in fixed positions via the voltage detection lines 48, or they can be disposed in fixed positions by attachment to electrode terminals 13 or the gas exhaust duct 6. With this structure, the circuit board 7 can be pressed onto the battery block 2 terminal plane 2A to join the connectors 42, 43 and connect the circuit board 7 to each electrode terminal 13.

Figure 15:
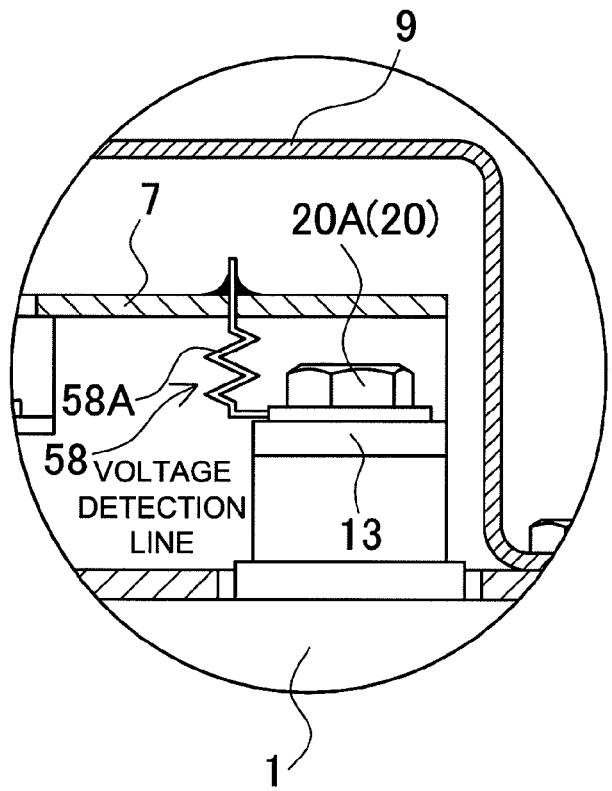
FIG. 15 is an enlarged cross-section view showing another example of a voltage detection line.
Figure 16:
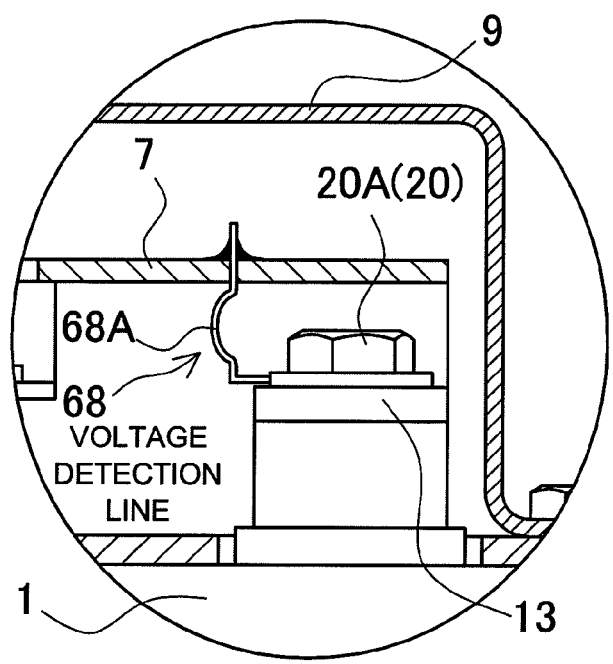
FIG. 16 is an enlarged cross-section view showing another example of a voltage detection line.

Further, the circuit board 7 can also be connected to each electrode terminal 13 by voltage detection lines 58, 68 configured as shown in FIGS. 15 and 16. The voltage detection lines 58, 68 of FIGS. 15 and 16 are conductive metal wire that can deform in a flexible manner. The voltage detection line 58 of FIG. 15 is provided with a folded region 58A at its center that can extend and contract. Similarly, the voltage detection line 68 of FIG. 16 is provided with a curved region 68A at its center that can extend and contract. These types of structures can connect the electrode terminals 13 of each battery cell 1 to the circuit board 7 while absorbing any shift in the relative position of the circuit board 7 and the battery block 2.

The voltage detection lines 8, 48, 58, 68, 78 are short resulting in low impedance, and each voltage detection line 8, 48, 58, 68, 78 has a uniform length resulting in equal impedances. Consequently, each electrode terminal 13 is connected with the circuit board 7 by voltage detection lines 8, 48, 58, 68, 78 of the same length. Since the circuit board 7 is disposed on the battery block 2 terminal plane 2A and voltage detection lines 8, 48, 58, 68, 78 can be made extremely short, impedance is low and the battery system can accurately measure the voltage of each battery cell 1 even if there is some difference in the length of the voltage detection lines. Consequently, as shown in FIG. 12, by attaching connectors 42 to mate with the connecting side of the circuit board 7, battery cell 1 voltage can be accurately measured even if there is some difference in the length of the voltage detection lines 48 connected to each electrode terminal 13.

The battery system of FIGS. 2-5 has a gas exhaust duct 6 mounted at the center of the battery block 2 terminal plane 2A. This gas exhaust duct 6 is provided with connecting flanges 6B projecting from both sides and positioned above the endplates 4 to attach the gas exhaust duct 6 to the endplates 4 via set screws 19.

Further, the gas exhaust duct 6 has end regions formed in (rectangular) cylindrical shapes, and the gas exhaust duct 6 is attached to the endplates 4 with these cylindrical regions projecting out from the endplates 4 as cylindrical projections 6A. Although not illustrated, passage-ways such as exhaust ducting can connect to these cylindrical projections 6A allowing any gas exhausted from the safety valve exhaust opening 12 of a rectangular battery 10 to be quickly discharged to the outside.

Figure 2:
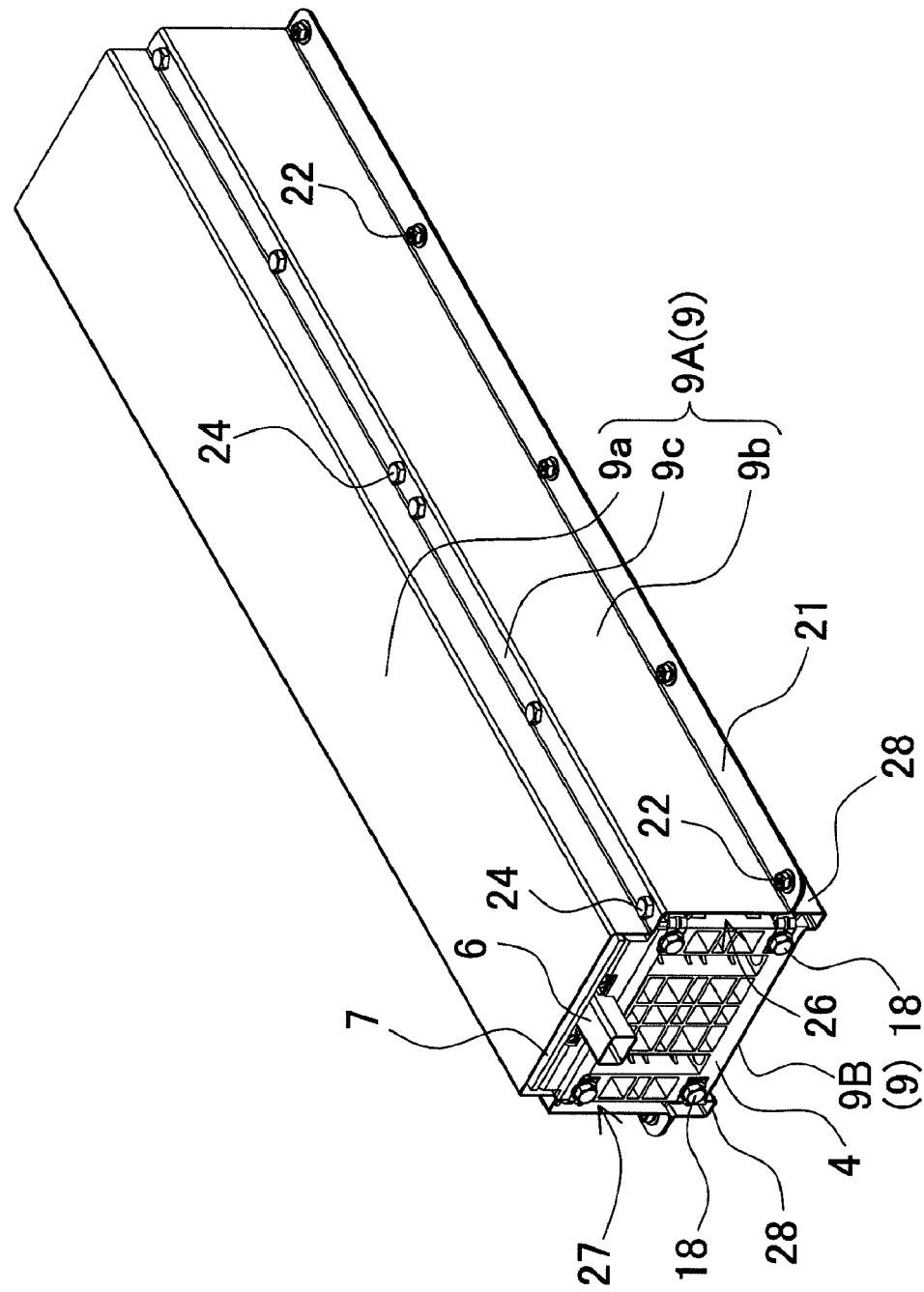
FIG. 2 is an oblique view of a car battery system for one embodiment of the present invention.

The battery system of FIGS. 2 and 5 has the upper case 9A of its outer case 9 attached above the gas exhaust duct 6. The outer case 9 of the figures is made up of an upper case 9A and a lower case 9B. The upper case 9A and the lower case 9B have flanges 21 that project outward, and these flanges 21 are connected via bolts 22 and nuts 23. In the outer case 9 of the figures, the flanges 21 are disposed at the side-walls of the battery block 2. In this outer case 9, the lower case 9B is attached to the endplates 4 via set screws 24 to hold the battery block 2. Set screws 24 pass through the lower case 9B and screw into holes (not illustrated) in the endplates 4 to attach the battery block 2 to the outer case 9. The heads of these set screws 24 protrude out from the bottom of the lower case 9B.

The upper case 9A is sheet metal formed with a top panel 9a that covers the top of the gas exhaust duct 6 and is connected on both sides with side panels 9b. The bottom edges of the side panels 9b of this upper case 9A have flanges 21, and these flanges 21 are connected to flanges 21 on the lower case 9B. Further, in the upper case 9A of the figures, step regions 9c are provided along the boundary between the top panel 9a and the side panels 9b, and these step regions 9c press down on both sides to attach to the battery block 2. The upper case 9A has the step regions 9c attached to the endplates 4 via set screws 24 to hold the battery block 2. Space 25 is provided between this upper case 9A and the top of the battery block 2, and the circuit board 7 is disposed in this space 25.

In addition, the outer case 9 is provided with an inlet duct 27 and an exhaust duct 26 between the side panels 9b and the battery block 2. In this battery system, forced ventilation air in the inlet duct 27 is passed through cooling gaps 16 between the rectangular batteries 10 to cool the batteries. Cooling air is discharged to the outside from the exhaust duct 26. Further, the lower case 9B is provided with projections 28 that protrude downward from both sides of the battery block 2. These projections 28 widen the inlet duct 27 and exhaust duct 26 to reduce pressure losses in those ducts. These projections 28 also reinforce the lower case 9B and increase the bending strength of the lower case 9B. In particular, since the lower case 9B shown in FIG. 5 is provided with projections 28 on both sides, bending strength is improved by the two rows of side projections 28. Further, the projections 28 provided on both sides of the lower case 9B extend below the heads of the set screws 24 that attach the battery block 2, or they extend to the same height as the heads of the set screws 24. For a battery system with this type of lower case 9B installed on-board a car, the projections 28 set on an attachment plate allowing battery system weight to be distributed and supported over a wide area.

Figure 17:
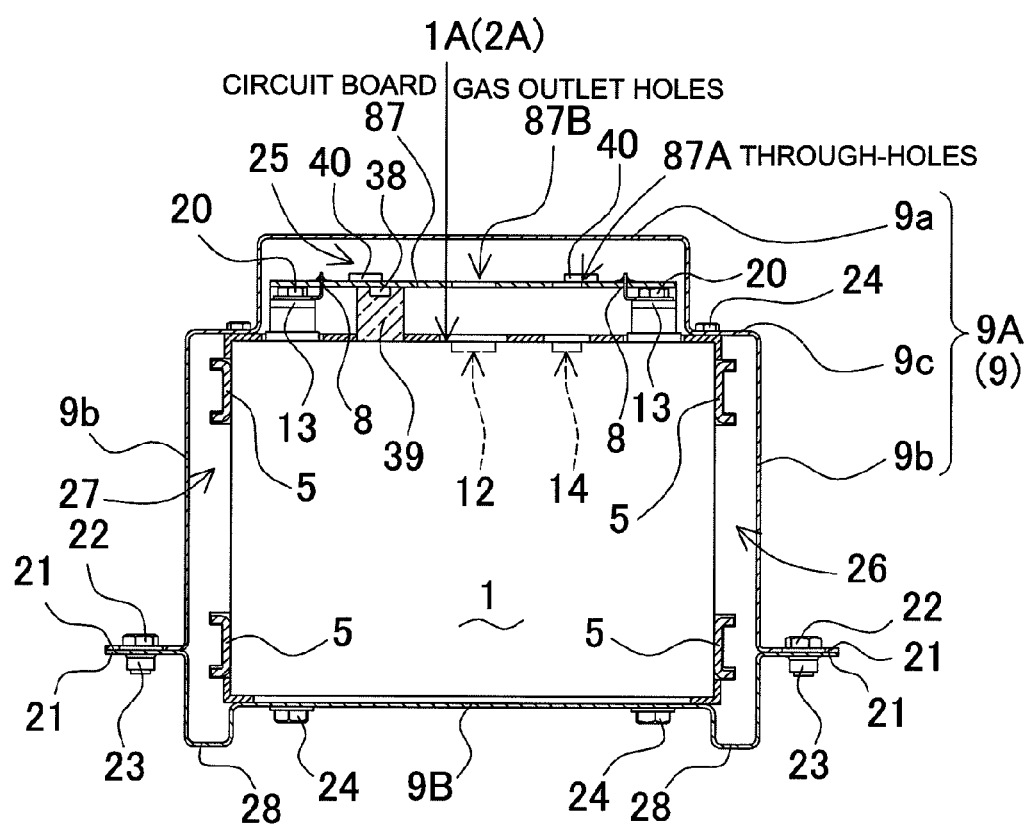
FIG. 17 is a lateral cross-section view of a car battery system for another embodiment of the present invention.

In the battery system described above, a gas exhaust duct 6 is provided to discharge any gas from a battery cell 1 with an open safety valve. Therefore, any high temperature gases can be safely exhausted to the outside. However, as shown in FIG. 17, instead of providing a gas exhaust duct, the battery system can be provided with gas outlet holes 87B that pass through the circuit board 87 at locations opposite safety valve exhaust openings 12 allowing gases to be discharged above the circuit board 87. Since a gas exhaust duct is not provided in this battery system, the circuit board 87 can be disposed in closer proximity to the battery block 2 terminal plane 2A. In the circuit board 87 of the figure, through-holes 87A for electrolyte filling are opened opposite battery cell 1 liquid filling openings 14, and gas outlet holes 87B for discharging gases are opened opposite safety valve exhaust openings 12. However, the circuit board can also use the through-holes 87A as gas outlet holes with the dual purposes of electrolyte filling and gas discharge.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2008-244923 filed in Japan on Sep. 24, 2008, the content of which is incorporated herein by reference.

What is claimed is:

1. A car battery system comprising:
   a plurality of battery cells, each battery cell having a positive electrode terminal and a negative electrode terminal;
   a battery block that retains the plurality of battery cells in a stacked configuration and has a terminal surface that is formed by battery cell terminal surfaces established by the positive and negative electrode terminals of the battery cells;
   a circuit board which has a first surface facing the battery block and a second surface facing away from the battery block; and
   a battery state detection circuit that is connected by voltage detection lines to the electrode terminals of each battery cell to detect the condition of each battery cell,
   wherein the circuit board is provided with surface-mounted electronic components that implement the battery state detection circuit,
   wherein the circuit board is a single-sided board with the electronic components mounted on only the second surface of the circuit board,
   wherein the circuit board is attached to the battery block opposite the terminal surface of the battery block, and the first surface of the circuit board faces the terminal surface,
   wherein the positive and negative electrode terminals of each battery cell are connected to the circuit board and to the battery state detection circuit,
   wherein the first surface of the circuit board which faces the battery block is an insulating surface,
   wherein an insulating layer is interposed between the insulating surface of the circuit board and the terminal surface of the battery block, and
   wherein the voltage detection lines are configured to reduce line impedance for connections between each battery cell and the battery state detection circuit, and to make line impedance uniform between the voltage detection lines for allowing high precision voltage measurements for the battery cells.

2. The car battery system of claim 1, wherein the insulating layer is disposed on the first surface of the circuit board facing the battery block.

3. The car battery system of claim 1, wherein the circuit board is a double-layer board with a blind layer,
   wherein the insulating layer is the blind layer and is laminated on the first surface of the circuit board facing the battery block.

4. The car battery system of claim 3, wherein the circuit board has a conducting layer at the interface with the blind layer.

5. The car battery system of claim 1, further comprising:
   temperature sensors which measure battery temperature,
   wherein the temperature sensors are in thermal contact with the battery cells and are mounted on the circuit board.

6. The car battery system of claim 1, wherein the battery cells are provided with liquid filling openings in their terminal surfaces, and the circuit board has through-holes opened in positions opposite the liquid filling openings in the battery cells.

7. The car battery system of claim 1, wherein the battery cells are provided with safety valve exhaust openings in their terminal surfaces, and the circuit board has gas outlet holes opened in positions opposite the safety valve exhaust openings to pass discharged gas.

8. The car battery system of claim 1, wherein the battery cells are provided with safety valve exhaust openings in their terminal surfaces, and a gas exhaust duct is disposed between the terminal surface of the battery block and the circuit board in a manner connecting the exhaust openings.

9. The car battery system of claim 8, wherein the circuit board is attached to the gas exhaust duct.

10. The car battery system of claim 1, wherein the circuit board is connected to the positive and negative electrode terminals of each battery cell via voltage detection lines, and wherein the voltage detection lines are connected to approximately the same locations on the electrode terminals of each battery cell.

11. The car battery system of claim 1, wherein the battery cells are rectangular batteries, the electrode terminals of each rectangular battery are bent in opposite directions, the electrode terminals of adjacent rectangular batteries are joined in an overlapping configuration, and electrode terminals joined in the overlapping configuration are connected by bolts and nuts.

12. The car battery system of claim 1, wherein the circuit board is provided with a layer of thin metal conducting regions only on the second surface, and electronic component leads are soldered to the conducting regions to mount the electronic components on only one side of the circuit board.

13. The car battery system of claim 1, wherein the circuit board has through-holes that pass through both surfaces of the circuit board, and voltage detection lines connected to battery cell electrode terminals are inserted in the through-holes and are solder attached to the circuit board.

14. The car battery system of claim 13, wherein the circuit board has a conducting layer on the insulating surface of the circuit board at a position corresponding to the through-holes.

15. The car battery system of claim 1, wherein voltage detection lines connected to electrode terminals are routed around the edges of the circuit board to the top of the circuit board and solder-attached to conducting regions provided on the upper surface.

16. The car battery system of claim 1, further comprising:
a voltage detection line connected to one of the electrode terminals; and
a connector attached at one end of the voltage detection line,
wherein the connector mates with another connector mounted on the circuit board to connect the electrode terminal and the circuit board.

17. The car battery system of claim 16, wherein the circuit board has connectors attached to the first surface that faces the battery block, and the connectors mate with connectors connected to electrode terminals via voltage detection lines.

18. The car battery system of claim 1, wherein a connecting terminal that connects a voltage detection line to an electrode terminal and fasteners that join adjacent battery cell electrode terminals are provided, and
wherein the connecting terminal is attached to the electrode terminal via the fasteners.

19. The car battery system of claim 18, wherein the connecting terminal is formed from sheet metal, has a connecting hole at one end to insert a fastener bolt, a vertical connecting section at the other end with a long narrow rod-shape, and this vertical connecting section is inserted through the circuit board as a voltage detection line that is solder attached to the circuit board.

20. The car battery system of claim 1, wherein the circuit board is connected to the positive and negative electrode terminals of each battery cell via voltage detection lines, and each voltage detection line is a flexibly deformable conducting metal wire.

21. The car battery system of claim 20, wherein the center section of the voltage detection line is provided with a folded region that can extend and contract.

22. The car battery system of claim 20, wherein the center section of the voltage detection line is provided with a curved region that can extend and contract.

23. The car battery system of claim 1, wherein the circuit board is connected to the positive and negative electrode terminals of each battery cell via voltage detection lines, and
wherein the voltage detection lines are configured to reduce line impedance of connections between each battery cell and the battery state detection circuit.

24. A car battery system comprising:
a plurality of battery cells, each battery cell having a positive electrode terminal and a negative electrode terminal;
a battery block that retains the plurality of battery cells in a stacked configuration and has a terminal surface that is formed by battery cell terminal surfaces established by the positive and negative electrode terminals of the battery cells;
a circuit board which has a first surface facing the battery block and a second surface facing away from the battery block; and
a battery state detection circuit that is connected to the electrode terminals of each battery cell to detect the condition of each battery cell,
wherein the circuit board is provided with surface-mounted electronic components that implement the battery state detection circuit,
wherein the circuit board is a single-sided board with the electronic components mounted on only the second surface of the circuit board,
wherein the circuit board is attached to the battery block opposite the terminal surface of the battery block, and the first surface of the circuit board faces the terminal surface,
wherein the positive and negative electrode terminals of each battery cell are connected to the circuit board and to the battery state detection circuit,
wherein the first surface of the circuit board which faces the battery block is an insulating surface,
wherein an insulating layer is interposed between the insulating surface of the circuit board and the terminal surface of the battery block,
wherein the circuit board has through-holes that pass through both surfaces of the circuit board, and voltage detection lines connected to battery cell electrode terminals are inserted in the through-holes and are solder attached to the circuit board,
wherein the circuit board has a conducting layer on the insulating surface of the circuit board at a position corresponding to at least one of the through-holes,
wherein the conducting layer is located between the insulating surface of the circuit board and the insulating layer, and
wherein the voltage detection lines are configured to reduce line impedance for connections between each battery cell and the battery state detection circuit, and to make line impedance uniform between the voltage detection lines for allowing high precision voltage measurements for the battery cells.

* * * * *